United States Patent [19]

Hwang et al.

[11] Patent Number: 4,816,884
[45] Date of Patent: Mar. 28, 1989

[54] HIGH DENSITY VERTICAL TRENCH TRANSISTOR AND CAPACITOR MEMORY CELL STRUCTURE AND FABRICATION METHOD THEREFOR

[75] Inventors: Wei Hwang, Armonk; Nicky C. Lu, Yorktown Heights, both of N.Y.

[73] Assignee: International Business Machines Corporation, Armonk, N.Y.

[21] Appl. No.: 75,791

[22] Filed: Jul. 20, 1987

[51] Int. Cl.[4] .................... H01L 29/78; H01L 29/06; H01L 27/02
[52] U.S. Cl. ..................................... 357/23.6; 357/55; 357/41
[58] Field of Search ........................... 357/23.6, 55, 41

[56] References Cited

FOREIGN PATENT DOCUMENTS 0187237  7/1986  European Pat. Off. ............ 357/23.6
58-3269A 1/1983  Japan .
59-19366 1/1984  Japan .

OTHER PUBLICATIONS

IBM Technical Disclosure Bulletin, vol. 27, No. 12, May 1985, Dynamic RAM Cell Structure, p. 7051.
IBM Technical Disclosure Bulletin, vol. 29, No. 5, Oct. 1986, High Density Verical DRAM Cell, p. 2335.
IBM Technical Disclosure Bulletin, vol. 27, No. 11, Apr. 1985, Dynamic RAM Cell with Merged Drain and Storage, p. 6694.

Primary Examiner—Andrew J. James
Assistant Examiner—Robert P. Limanek
Attorney, Agent, or Firm—John J. Goodwin

[57] ABSTRACT

A semiconductor memory cell structure incorporating a vertical access transistor over a trench storage capacitor including a semiconductor wafer having a semiconductor substrate and an epitaxial layer disposed thereon. A relatively deep polysilicon filled trench is disposed in the epitaxial layer and substrate structure, the deep trench having a composite oxide/nitride insulation layer over its vertical and horizontal surfaces to provide a storage capacitor insulator. A relatively shallow trench is disposed in the epitaxial layer over the deep trench region, the shallow trench having an oxide insulation layer on its vertical and horizontal surfaces thereof. A neck structure of epitaxial polysilicon material extends from the top surface of the polysilicon filled deep trench to the bottom surface of the shallow trench. Impurities are disposed in the epitaxial layer on either side of the shallow trench to form semiconductor device drain junctions and polysilicon material is disposed in the shallow trench and over the epitaxial layer to form semiconductor device transfer gate and wordline regions respectively.

3 Claims, 5 Drawing Sheets

HIGH DENSITY VERTICAL TRENCH TRANSISTOR AND CAPACITOR MEMORY CELL STRUCTURE AND FABRICATION METHOD THEREFOR

BACKGROUND OF THE INVENTION

1. Field of the Invention

The present invention relates to dynamic random access memory cell structures and fabrication methods therefor, and more particularly to a vertical trench transistor and trench capacitor structure and fabrication process therefor.

2. Background Art

The following references are representative of the background art available prior to the present invention.

Japanese Patent No. 59-19366 describes a vertical FET semiconductor memory device disposed between condensers for storing charge. Electrostatic capacity from the device substrate is utilized for storing the memory charge.

Japanese Patent No. 58-3269 relates to a vertical one-transistor MOS memory cell having a cylindrical gate electrode, an insulating layer and source and drain layers. The source or drain layer can also be one electrode of a charge storage capacitor.

The publication entitled DYNAMIC RAM CELL STRUCTURE, IBM Technical Disclosure Bulletin, Vol 27, No. 12, May 1985 at page 7051 relates generally to integrated circuit structures and more particularly to dynamic random-access memory (DRAM) cell construction having a stacked planar MOS access transistor over a buried pn junction storage capacitor.

The publication entitled HIGH DENSITY VERTICAL DRAM CELL, IBM Technical Disclosure Bulletin, Vol. 29, No. 5, October 1986 at page 2335, describes a high density vertical trench DRAM (dynamic random-access memory) cell wherein the transfer device is oriented in the vertical direction and is positioned over a trench storage capacitor. A shallow trench filled with polysilicon or polycide serves as the MOS transfer device gate. Transfer MOSFETs of adjacent cells share the same gate.

The publication entitled DYNAMIC RAM CELL WITH MERGED DRAIN AND STORAGE, IBM Technical Disclosure Bulletin, Vol. 27, No. 11, April 1985 at page 6694 relates generally to the fabrication of integrated circuits and more particularly to the construction of a dynamic random-access memory cell requiring less space.

SUMMARY OF THE INVENTION

An object of the present invention is to provide an improved high density one-transistor dynamic random-access-memory (DRAM) cell structure.

Another object of the present invention is to provide an improved memory cell structure including a vertical transistor and trench capacitor.

Another object of the present invention is to provide an improved DRAM cell structure which has a vertical transistor built on the surfaces of a U-groove between the surface of the silicon and a trench storage capacitor buried beneath the U-groove.

Another object or the present invention is to provide an improved fabrication process for providing high density by decoupling the dimensions of the vertical access transistor from the size of trench storage capacitor.

Another object of the present invention is to provide an improved fabrication process for providing an epitaxial layer on a silicon substrate and over predefined insulator-capped islands, which forms a self-aligned contact connection in the epitaxial layer.

Still another object of the present invention is to provide an improved fabrication process for providing a connection between the vertical device made in the epitaxial layer and the device below the predefined insulator-capped islands and forming a self-aligned contact-connection in the epitaxial layer.

A further object of the present invention is to provide a fabrication method for a DRAM device wherein the connection between the source region of the vertical access transistor and the storage electrode of the trench capacitor is formed by two selective epitaxial growth to provide a self-aligned contact.

DISCLOSURE OF THE INVENTION

Figure 1:
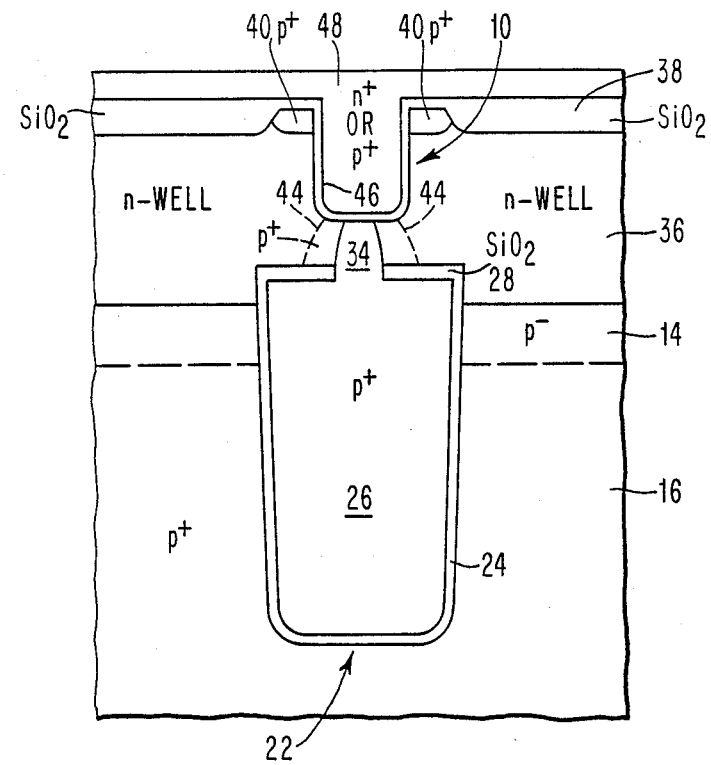
FIG. 1 is a schematic cross-sectional illustration of a memory cell including a vertical access transistor and storage capacitor according to the principles of the present invention.
Figure 2:
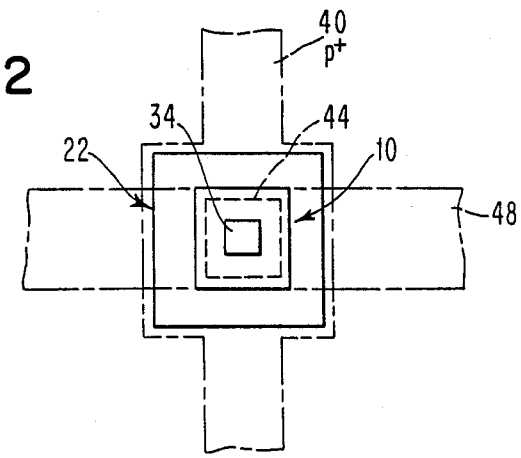
FIG. 2 is a schematic plan view illustration of the layout of the memory cell of FIG. 1.

A new high density vertical trench transistor and trench capacitor DRAM (dynamic random access memory) cell is described. The cross section of this new vertical DRAM cell is shown in FIG. 1 and its schematic plan view layout is shown in FIG. 2. FIG. 1 shows a U-groove shallow trench access transistor 10 stacked on top of a U-groove deep substrate-plate trench (SPT) storage capacitor 22. For simplicity, this cell structure is called a U-SPT cell. Arrangement of the vertical access transistor 10 and the trench storage capacitor 22 as shown in FIG. 1 are different from those of the conventional planar and trench DRAM cells described by H. Sunami in the publication "Cell structures for future DRAM's", IEDM Tech. Dig., pp. 694–697, 1985 and by W. F. Richardson et al, in the publication "A trench transistor cross-point DRAM cell", IEDM Tech. Dig., pp. 714–717, 1985 because it will give the advantages of ultra small size, high packing density, lower soft error rate, less leakage and punch-through currents and better noise immunity.

The new cell is fabricated successfully by using a new self-alignment epitaxial growth method in combination with state-of-the-art CMOS technologies. Two epitaxial layers are grown with an intervening oxide etching step over a substrate wafer already provided with trench storage capacitors. The first and second epitaxial layers simultaneously grow vertically on the bare silicon surrounding the buried storage capacitor and laterally over the oxide. The trench transistor is fabricated in the epitaxial layers.

FIG. 1 illustrates a cross-sectional view of a U-SPT cell fabricated using the method of the present invention illustrated in FIGS. 3 through 10, with a top view shown in FIG. 2. The structure of the device of FIG. 1 includes a silicon substrate 16 which, for the purposes of explanation, is p+ type. A p-channel transfer device with gate 48, source 44, and drain 40 is made in an n-well region 36 within a p-type epitaxial layer 14. A trench capacitor is located in substrate 16 and filled with heavily doped p+ polysilicon 26. A composite film 24 of $SiO_2/Si_3N_4/SiO_2$ on the trench sidewalls is provided for the capacitor storage insulator. A p+ doped vertical connection 34 is formed to connect the source region of the transfer device and the storage electrode 26 of the trench capacitor. An interconnection diffusion line 40 used for the bitline is connected to the drain region of the transfer device.

The method steps of the present invention for fabricating the U-SPT structure of FIG. 1 are described as follows:

Step (1) A p- doped monocrystalline silicon film 14 is grown epitaxially on p+ doped substrate 16. A composite layer 12 of $SiO_2$ 20 and $Si_3N_4$ 18 is formed on epitaxial layer 14. After suitable lithography steps, an opening is made in composite layer 12. The composite layer 12 which remains is then used to mask the etch of a trench 12 into substrate 16 by RIE (reactive ion etching) as shown in FIG. 3.

Step (2) After a thin $SiO_2$ layer is thermally grown on the trench surface, a thin $Si_3N_4$ layer is deposited and thermally densified in an oxidizing ambient to form composite film 24 for the capacitor storage insulator. A thick, p+ doped polysilicon layer 26 is then deposited to fill the trench as shown in FIG. 3.

Figure 3:
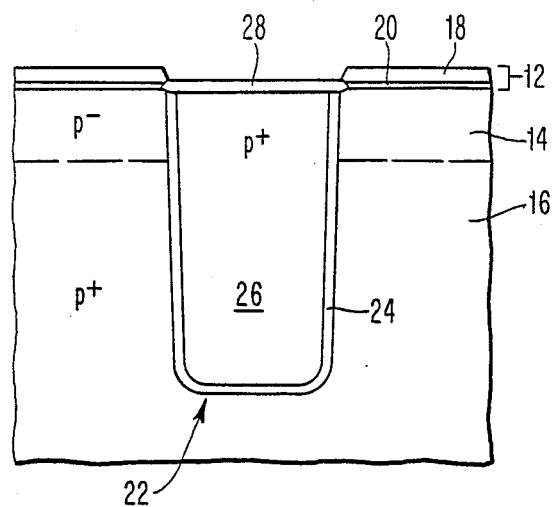
FIGS. 3, 4, 5, 6, 7, 8, 9 and 10 show schematic cross-sectional views illustrating various stages in the fabrication of the memory cell structure or FIGS. 1 and 2 employing a method according to the principles of the present invention.

Step (3) The polysilicon film 26 is planarized by RIE and/or chemical-mechanical polishing such that the surface of polysilicon 26 is coplanar with the top of substrate 14 as shown in FIG. 3. The nitride/oxide layer 12 over the substrate surface is used for etch stop.

Step (4) An $SiO_2$ layer 28 is thermally grown on polysilicon 26. The presence of composite film 12 on the monocrystalline regions prevents oxidation of epitaxial layer 14 as shown in FIG. 3. The thickness of $SiO_2$ layer 28 is much greater than that of the $SiO_2$ portion 20 of composite layer 12.

Step (5) The $Si_3N_4$ portion 18 of composite layer 12 is removed by selective isotropic etching. The $SiO_2$ portion 20 of composite layer 12 is then entirely removed, leaving a thickness of $SiO_2$ layer 28 on polysilicon 26 by virtue of its much greater thickness compared to the $SiO_2$ portion 18 of composite layer 12.

Figure 4:
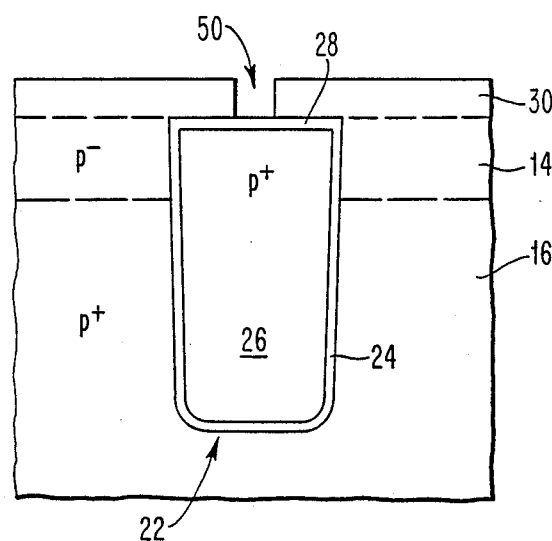

Step (6) A monocrystalline, p-type doped layer 30 is grown epitaxially on the exposed surface of epitaxial layer 14 as shown in FIG. 4. Epitaxial layer 30 grows laterally over $SiO_2$ layer 28 at approximately the same rate as it grows vertically from epitaxial layer 14. In this way, the growth of epitaxial layer 30 is controlled to produce a lateral "window" 50 between its advancing edges over $SiO_2$ layer 28, illustrated by cross section views.

Figure 5:
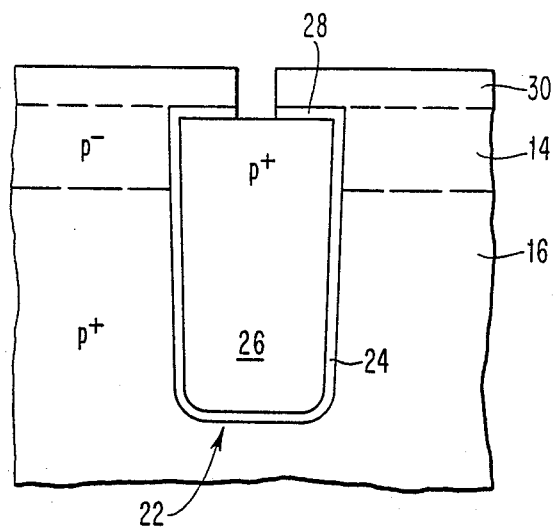

Step (7) The "window" 50 in epitaxial layer 30 is used as a self-aligned mask for removing $SiO_2$ layer 28 over polysilicon 26 in window area 50 by either wet chemical, dry plasma or reactive ion etching, as shown in FIG. 5. Thus, a contact region to the trench fill polysilicon 26 is established by a self-aligned epitaxial growth technique rather than by lithographic masking steps.

Figure 6:
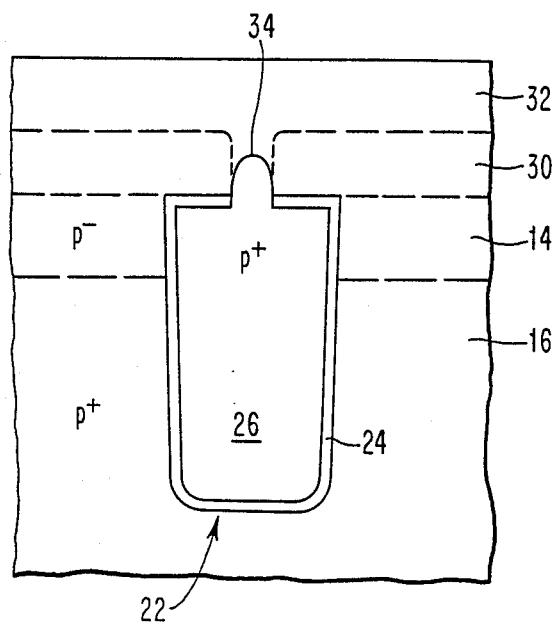
Figure 7:
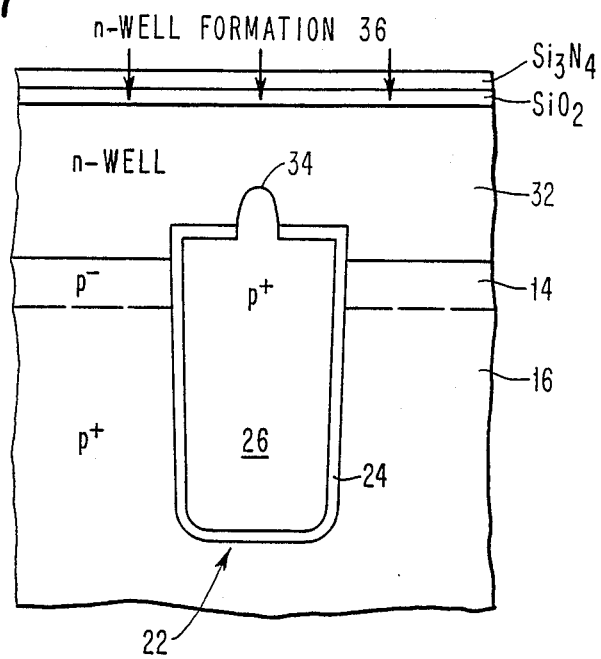

Step (8) After opening the contact region, another epitaxial layer 32 is grown to fill window 50 as shown in FIG. 6. Note that during this growth a pyramidal region 34 of polycrystalline silicon called "neck" results in the window 50 area of polysilicon trench fill 26.

Dopant diffusion from polysilicon trench fill 26 into the polycrystalline region of epitaxial layer 34 during this step and subsequent heat treatments forms a conductive region between the polysilicon trench fill 26 and the wafer surface.

At this point, n-well region, isolation region and p-channel vertical FET device regions are then fabricated in combination with state-of-the-art CMOS and trench technologies to produce the structure shown in FIG. 1, which is described in the next five steps.

Step (9) A composite layer of pad $SiO_2$ and $Si_3N_4$ is formed on the substrate. After suitable lithography and photoresist steps, an opening is made in the photoresist layer to expose the regions for n-well formation. Then n-type dopants are implanted through the composite layer of $SiO_2$ and $Si_3N_4$ on the substrate to form n-well 36 regions. Photoresist outside the n-well region blocks the n-type implantation into the n-channel device regions. After the photoresist is removed, a short thermal cycle is used to drive in the n-type dopant into the substrate 16.

Figure 8:
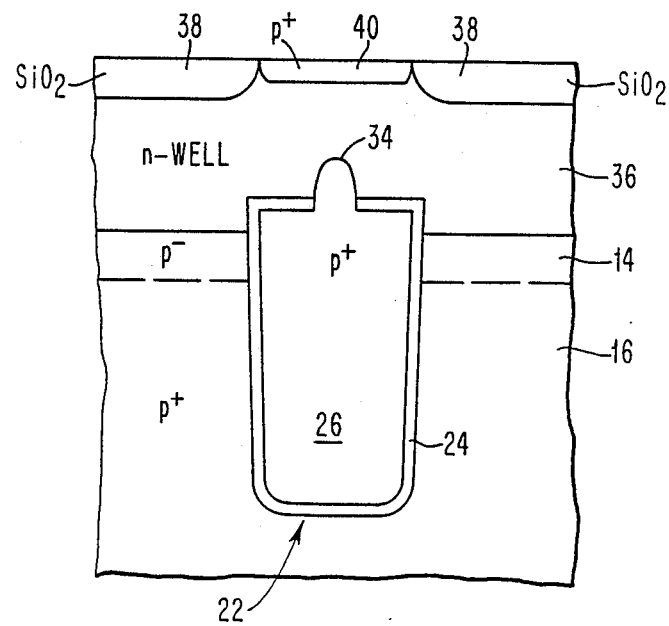

Step (10) As shown in FIG. 8, define the shallow oxide isolation region 38 after suitable lithography steps. The composite-layer which remains is then used to mask the etch of a shallow trench isolation 18 into substrate 16 by RIE (reactive ion etching). A thin oxide is grown over the shallow trench isolation 38 surface, followed by depositing a thick oxide layer to fill the shallow trench isolation and planarization to result in a coplanar surface between the oxide isolation 38 and substrate surface. After suitable lithography and photoresist steps, then p-type dopants are implanted through the composite layer of $SiO_2$ and $Si_3N_4$ on the surface of n-well to form a p+ diffusion region 40. Then the composite layer of $SiO_2$ and $Si_3N_4$ is removed. The p+ diffusion region 40 will be formed as a drain junction of the access transistor and also serve as a diffusion bitline.

Figure 9:
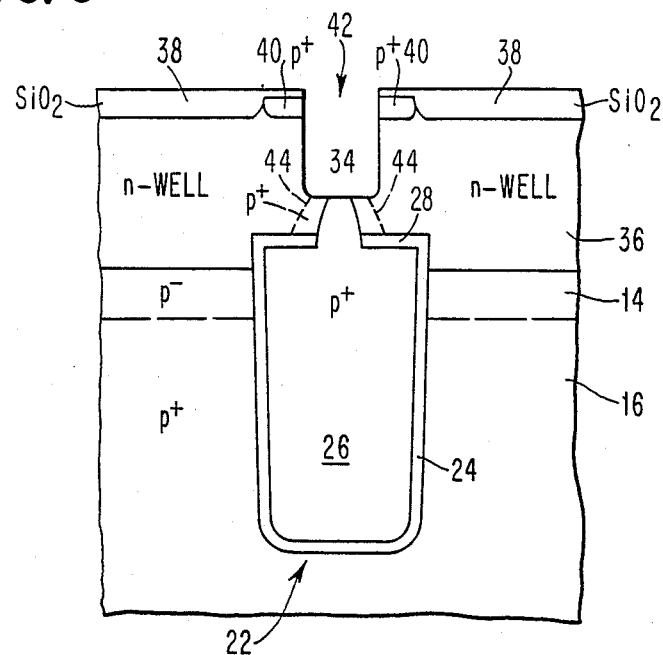

Step (11) A composite layer of pad $SiO_2$ and $Si_3N_4$ is formed on epitaxial p-layer 32. After suitable mask and lithography steps, an opening is made in composite layer. The composite layer which remains is then used to mask the etch of a shallow trench 42 in n-well regions 36 by RIE to form vertical access transistor region as shown in FIG. 9. The depth of this shallow trench is designed to connect to (or stack on) polysilicon p+ neck epi region 34. Because of the high diffusivity of the neck p+ pi region 34, the buried source junction 44 of the access transistor will be formed. The novel buried p+contact (connection) between the buried source junction of the transistor and polysilicon inside the storage trench capacitor is formed automatically through the subsequent hot temperature cycle.

Figure 10:
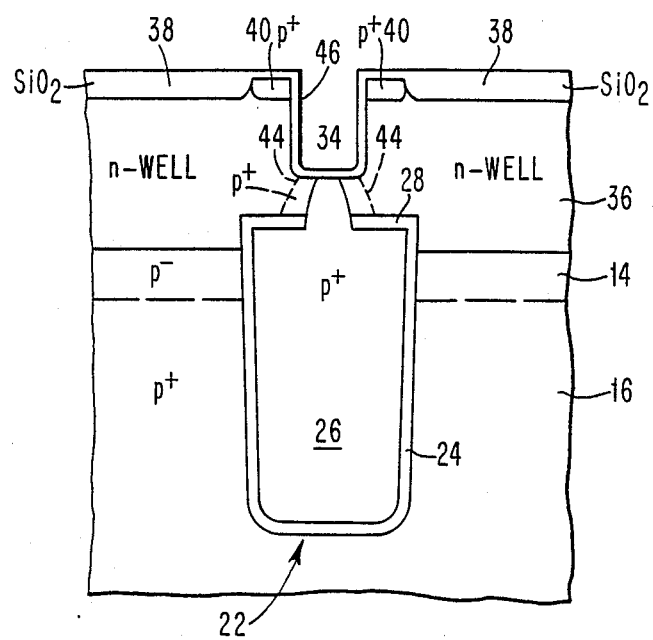

Step (12) Grow a thin gate oxide 46 on the vertical walls at the shallow trench as shown in FIG. 10.

Step (13) As shown in FIG. 1, fill the shallow trench with either n+ or p+ CVD polysilicon 48, polycide, or any suitable conductive material to form the transfer gate and wordline. The drain and source regions of the p-channel vertical transistor have been formed in Steps 10 and 11, respectively. The rest of the fabrication processes are kept the same as standard CMOS technology to complete the cell structure. The final cross section of the U-SPT cell is shown in FIG. 1.

The memory cell can be made n-channel device without loss of generality by reversing the dopant polarity of polysilicon trench fill 26, forming a p-type "well" region in epitaxial layers 14, 30 and 32, and forming n-channel FET devices as transfer devices in the p-type well.

The new U-SPT cell has solved several problems of prior art memory cells and has a better packing density and electrical behavior. The advantages are as follows:

The layout of the new cell as shown in FIG. 2 results in high density because the cell is located at a crosspoint between the wordline and bitline, and the cell transistor and capacitor are vertically oriented.

The cell can have a large capacitor top surface area and a small transistor planar surface area because the minimum cell size of this new cell of FIGS. 1 and 2 is determined by the opening of the deep trench capacitor, but not by the opening of the trench transistor.

Since the small U-trench transistor as stacked on top of the larger deep trench capacitor, a wider isolation region between two trench transistors in adjacent cells results. This means that the punch-through current between two cells can be further reduced.

The processes to form the novel buried connection between the access transistor and storage capacitor, and to form the buried source junction of the access transistor have self-alignment feature.

The access transistor is a bulk transistor and is different from other 3-D silicon-on-insulator (SOI) DRAM cells in that the U-SPT cell can have a high quality crystalline transistor with stable body bias. Furthermore, the storage node is inside the trench and the access device is fabricated in an n-well, which can achieve lower soft error rate, higher noise immunity and firmly grounded substrate plate.

We claim:

1. A semiconductor memory cell structure of the type including a vertical access transistor self-aligned over a trench storage capacitor comprising:
   a semiconductor wafer including a first semiconductor type substrate and a second semiconductor type epitaxial layer disposed thereon,
   a relatively deep trench disposed in said epitaxial layer and substrate structure, said deep trench including a composite oxide/nitride insulation layer over the vertical and horizontal surfaces thereof to provide a storage capacitor insulator, and wherein said deep trench is filled with first semiconductor type polysilicon,
   a relatively shallow trench disposed in said epitaxial layer over said deep trench region, said shallow trench including an oxide insulation layer on the vertical and horizontal surface thereof,
   a neck structure of epitaxial polysilicon material extending from the top surface of said polysilicon filled deep trench to the bottom surface of said shallow trench disposed thereover,
   source regions disposed in said epitaxial layer around said neck structure between the top surface of said polysilicon filled deep trench and the bottom of said shallow trench, said total lateral width of said neck structure and said source regions being substantially smaller than the lateral width of the top surface of said deep trench,
   impurities disposed in said epitaxial layer on either side of said shallow trench therein to form semiconductor device drain junctions,
   and polysilicon material disposed in said shallow trench and over said epitaxial layer to form semiconductor device transfer gate and wordline regions respectively.

2. A memory cell structure according to claim 1 wherein
   said semiconductor substrate is composed of p+ type semiconductor material,
   said epitaxial layers are comprised of p− type semiconductor material,
   said polysilicon in said deep trench and said epitaxial polysilicon neck and said source regions are composed of p+ type semiconductor material, and
   said polysilicon material in said shallow trench is composed of n+ type semiconductor material, 3. A memory cell structure according to claim 1 wherein
   said semiconductor substrate is composed of p+ type semiconductor material,
   said epitaxial layers are comprised of p− type semiconductor material,
   said polysilicon in said deep trench and said epitaxial polysilicon neck and said source regions are composed of p+ type semiconductor material, and
   said polysilicon material in said shallow trench is composed of p+ type semiconductor material.

* * * * *